(12) United States Patent
Bauer et al.

(10) Patent No.: US 8,471,572 B2
(45) Date of Patent: Jun. 25, 2013

(54) CAPACITIVE SENSOR TO SENSE AN ELECTRIC FIELD GENERATED BY A CONDUCTOR

(75) Inventors: Alberto Bauer, Tierra Verde, FL (US);
Lorenzo Peretto, Fratta Polesine (IT);
Roberto Tinarelli, Bologna (IT);
Andrea Mollo, Mezzo Goro (IT)

(73) Assignee: Green Seas Ventures, Ltd, Tortola (VG)

( * ) Notice: Subject to any disclaimer, the term of this patent is extended or adjusted under 35 U.S.C. 154(b) by 364 days.

(21) Appl. No.: 12/997,941

(22) PCT Filed: Jun. 17, 2009

(86) PCT No.: PCT/IT2009/000263
§ 371 (c)(1),
(2), (4) Date: Dec. 14, 2010

(87) PCT Pub. No.: WO2009/153823
PCT Pub. Date: Dec. 23, 2009

(65) Prior Publication Data
US 2011/0121842 A1     May 26, 2011

(30) Foreign Application Priority Data
Jun. 20, 2008  (IT) .............................. BO08A0392 U

(51) Int. Cl.
*G01R 27/26*    (2006.01)
*G01R 31/302*   (2006.01)
*G01R 15/12*    (2006.01)

(52) U.S. Cl.
USPC ........................... 324/686; 324/754.27

(58) Field of Classification Search
USPC ........................ 324/686, 658, 754.27
See application file for complete search history.

(56) References Cited

U.S. PATENT DOCUMENTS

| | | | |
|---|---|---|---|
| 2001/0007420 A1* | 7/2001 | Bijawat et al. | 324/67 |
| 2005/0122118 A1* | 6/2005 | Zank et al. | 324/457 |
| 2006/0096856 A1* | 5/2006 | Martin | 204/298.21 |
| 2011/0109328 A1* | 5/2011 | Gulbranson | 324/664 |

FOREIGN PATENT DOCUMENTS

| | | |
|---|---|---|
| DE | 3641144 A | 6/1988 |
| DE | 4111260 A | 10/1992 |
| EP | 0134541 A | 3/1985 |
| EP | 0400491 A | 12/1990 |
| WO | 9805974 A | 2/1998 |

* cited by examiner

*Primary Examiner* — Jeff Natalini
(74) *Attorney, Agent, or Firm* — Andrew Wilford

(57) ABSTRACT

A capacitive sensor for detecting an electrical field generated by a live conductor comprises a source electrode (10), a screen element (20) and an electrical field sensor (30). Said source electrode (10) has a proximal portion (11) connected to the conductor (A) and a distal portion (12) placed inside the screen element (20). The electrical field sensor (30) is placed inside said screen element (20), and faces and is spaced apart from the distal portion (12) of said source electrode (10), in order to detect the electrical field emitted by said source electrode (10).

18 Claims, 5 Drawing Sheets

CAPACITIVE SENSOR TO SENSE AN ELECTRIC FIELD GENERATED BY A CONDUCTOR

CROSS REFERENCE TO RELATED APPLICATIONS

This application is the US national phase of PCT application PCT/IT2009/000263, filed 17 Jun. 2009, published 23 Dec. 2009 as WO2009/153823, and claiming the priority of Italian patent application BO2008A000392 itself filed 20 Jun. 2008, whose entire disclosures are herewith incorporated by reference.

TECHNICAL FIELD

The present invention relates to a capacitive sensor for detecting an electrical field generated by a live conductor, for example in order to determine the voltage of the conductor under examination with respect to the detected electrical field.

More specifically, the present invention relates to a capacitive sensor which enables the electrical field generated by a single live conductor to be detected without being affected by any surrounding electrical fields, such as the electrical fields generated by other conductors located nearby, with particular application to the technical field of detecting instruments and equipment for low, medium and high voltage lines and/or substations.

PRIOR ART

Known capacitive sensors for detecting electrical fields generated by live conductors do not enable the user to avoid the effect of surrounding electrical fields and/or to obtain sufficiently accurate measurements of the electrical field or of quantities derived therefrom.

OBJECT OF THE INVENTION

The object of the present invention is to overcome the aforementioned drawbacks.

The invention, which is defined in the claims, resolves the problem of creating a capacitive sensor for sensing an electrical field generated by a live conductor, in which said capacitive sensor comprises a source electrode, a screen element and an electrical field sensor, in which said capacitive sensor is characterized in that said source electrode has a proximal portion connected to the conductor and a distal portion placed inside the screen element, and in that said electrical field sensor is placed inside said screen element in such a way that it faces and is spaced apart from the distal portion of said source electrode, in order to detect only the electrical field emitted by said source electrode.

BRIEF DESCRIPTION OF THE APPENDED DRAWINGS

The following description of the capacitive sensor proposed by the present invention, in various practical embodiments, is provided by way of non-limiting example and makes reference to the appended drawings, in which.

DESCRIPTION OF THE FIRST EMBODIMENT—FIG. 1

Figure 1:
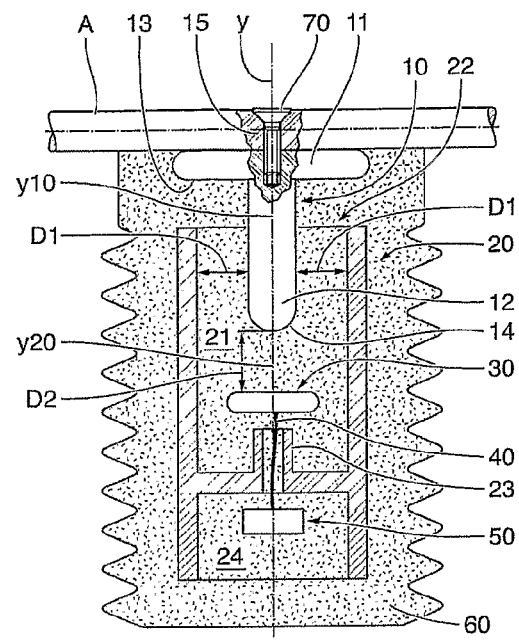
FIG. 1 shows schematically a first embodiment of the capacitive sensor proposed by the present invention.

With reference to FIG. 1, the capacitive sensor of the present invention extends along a longitudinal axis Y and has a proximal end which is, for example, associated with a low, medium or high voltage conductor or bar A.

Said capacitive sensor substantially comprises a source electrode 10, a screen element 20, an electrical field sensor 30, an electrical conductor 40, and a circuit 50 for treating the signal detected by the sensor 30, these elements being embedded and positioned inside and by means of a body 60 of dielectric material which forms an outer casing, in which, more specifically, said source electrode 10 has a proximal portion 11 connected to the conductor A and a distal portion 12 placed inside the screen element 20, and in which said electrical field sensor 30 is placed inside said screen element 20 in such a way that it faces and is spaced apart from the distal portion 12 of said source electrode 10, in order to detect the electrical field emitted by said source electrode 10 and/or by said distal portion 12 or distal end 14 of said source electrode 10.

More specifically, said distal portion 12 of the source electrode 10 is placed inside the screen element 20 with a minimum distance D1 between said two elements such that the dielectric strength of the dielectric body 60 is not exceeded, thus ensuring the requisite degree of insulation in order to preserve the insulating properties of the dielectric medium and maintain them over time.

With reference to the source electrode 10, this is of elongate cylindrical shape and extends along a longitudinal axis Y10 positioned coaxially with respect to the preceding axis Y of the capacitive sensor, and substantially comprises a proximal portion 11, preferably shaped in the form of a disc 13, and a distal portion, 12, which is of cylindrical shape with a rounded distal end 14, in order to provide a uniform distribution of the lines of force of the electrical field emitted and/or generated by said distal portion 12 or distal end 14.

With reference to the screen element 20, this is of tubular shape and extends along a longitudinal axis Y20 which is placed coaxially with respect to the preceding axes Y and Y10, and said screen element 20 is connected to earth or to a reference potential in order to provide a screening effect.

The proximal portion 11 of said source electrode 10 also comprises fixing members 15 for connecting it electrically to the conductor A, such as, for example, one or more tapped holes 15 designed to interact with a screw 70 placed in a hole of the conductor A.

Said screen element 20 comprises a first screened chamber 21 having a first open end 22 facing the conductor A, in which said source electrode 10, passing through said first end 22, has a distal portion 12 located inside said first screened chamber 21, while the electrical field sensor 30, which is also positioned inside said first screened chamber 21, is positioned so as to be axially spaced apart from the distal portion 12 or end 14 of said source electrode 20.

More specifically, said electrical field sensor 30 is positioned at a minimum distance D2 from the source electrode 10, in order not to exceed the dielectric strength of the dielectric body 60, and in order to provide the requisite degree of insulation, while also safeguarding the insulating properties of the dielectric medium and maintaining them over time.

Said screen element 20 also comprises a second screened chamber 24, positioned in the distal portion of said screen element 20, in which the second screened chamber 24 is capable of containing and positioning the signal treatment circuit 50.

Said screen element 20 can also comprise a screened duct 23 by means of which said first chamber 21 is made to communicate with said second chamber 24, in which an electrical conductor 40 is placed inside said screened duct 23 and connects the electrical field sensor 30 to the signal treatment circuit 50.

With reference to the electrical field sensor 30, this is preferably disc-shaped and is of the anisotropic type, in order to detect by means of reactive capacitive coupling the field components generated by the source electrode 10 which are orthogonal to the surface of said electrical field sensor 30 when they reach this surface.

Said electrical field sensor 30 can be constructed in various ways without departing from the inventive concept of the present invention.

With reference to the signal treatment circuit 50, this can receive, via the electrical conductor 40, the signals detected by the electrical field sensor 30, and can supply at its output a signal dependent on the magnitude detected by said electrical field sensor 30.

Said signal treatment circuit 50 can be constructed in various ways without departing from the inventive concept of the present invention.

With reference to the body 60 of dielectric material, this can be formed from an epoxy resin or other similar material.

With this structure, the electrical field sensor 30 detects only the field lines generated by the source electrode 10 and, more specifically, only the field lines emitted by its distal portion 12 or distal end 14, which are orthogonal to the surface of said electrical field sensor 30 when they reach this surface, while the field lines of any surrounding electrical fields, such as the field lines generated by conductors located in the vicinity, will converge on the screen element 20 without affecting said field sensor 30 and/or the electrical conductor 40 and/or the circuit 50, so that the electrical field generated by the conductor A can be measured correctly.

With reference to the screen element 20, this can be made in one piece or in two or more pieces associated with each other, without departing from the inventive concepts protected by the present invention.

Additionally, said screen element 20, and more specifically the corresponding two tubular portions, can be made from metallic mesh wound in tubular form, or from hollow cylinders having a specified thickness, or in any other way, without departing from the inventive concepts protected by the present invention.

*.*:*

Figure 2:
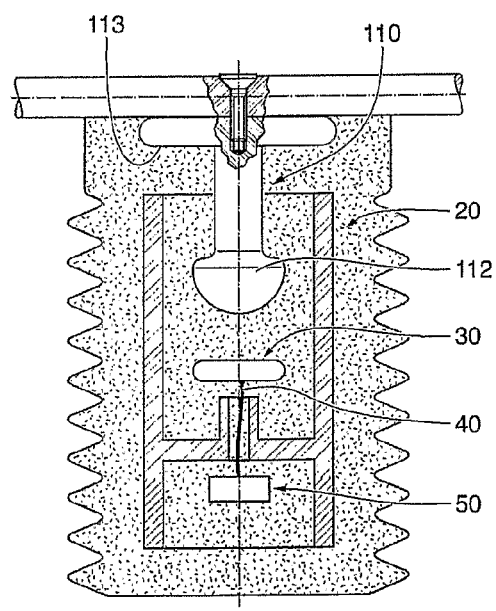
FIG. 2 shows schematically a second embodiment of the capacitive sensor proposed by the present invention.

Description of the Second Embodiment—FIG. 2

With reference to FIG. 2, this shows a variant embodiment in which the distal end portion of said source electrode, indicated here by 110, is shaped in the form of a spherical segment 112.

*.*:*

Figure 3:
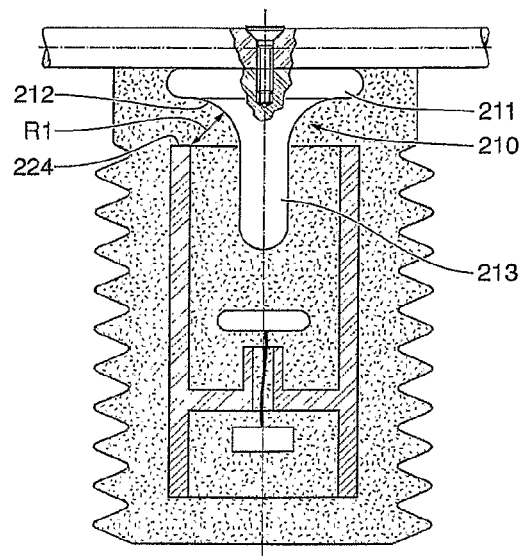
FIG. 3 shows schematically a third embodiment of the capacitive sensor proposed by the present invention.

Description of the Third Embodiment—FIG. 3

With reference to FIG. 3, this shows a variant embodiment in which the proximal portion 211 of said source electrode, indicated here by 210, is shaped in the form of a solid funnel with a stem 213 orientated towards the distal end.

Additionally, the sides 212 of said funnel are preferably rounded, with a radius of curvature R1 determined by the minimum distance to be maintained between the circular perimeter 224 of the proximal end of the screen element 220 and the source electrode 210 in order not to exceed the dielectric strength of the dielectric body 60, thus providing the required level of insulation.

Figure 4:
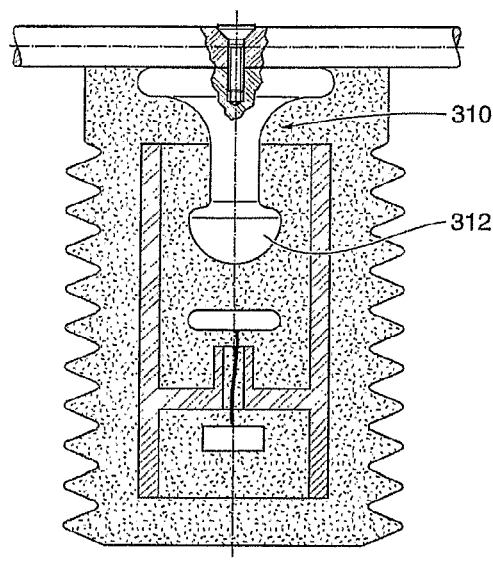
FIG. 4 shows schematically a fourth embodiment of the capacitive sensor proposed by the present invention.

Description of the Fourth Embodiment—FIG. 4

With reference to FIG. 4, this shows a variant embodiment in which the distal end of said source electrode, indicated here by 310, is shaped in the form of a spherical segment 312.

Figure 5:
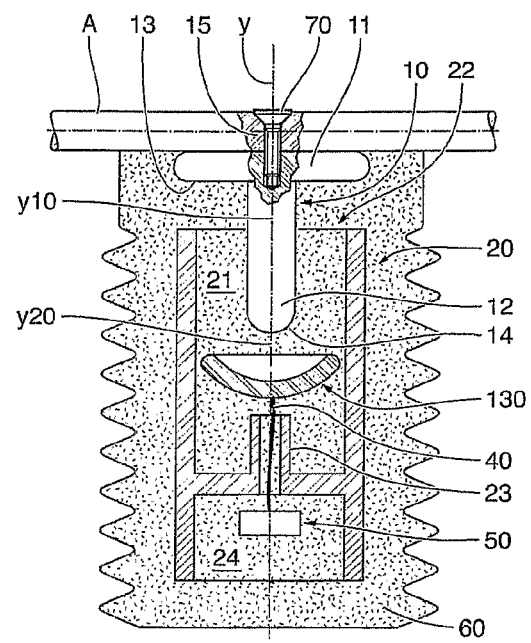
FIG. 5 shows schematically a fifth embodiment in the form of a variant of the embodiment of FIG. 1.

Description of the Fifth Embodiment—FIG. 5

With reference to FIG. 5, this shows a variant of the embodiment shown in FIG. 1.

In this fifth embodiment, the sensor, indicated by 130 in this figure, is shaped in the form of a spherical dome with its open base facing upwards and towards the source electrode 10.

In this context, the spherical dome 130 can be made from flat material or from metal mesh.

Figure 6:
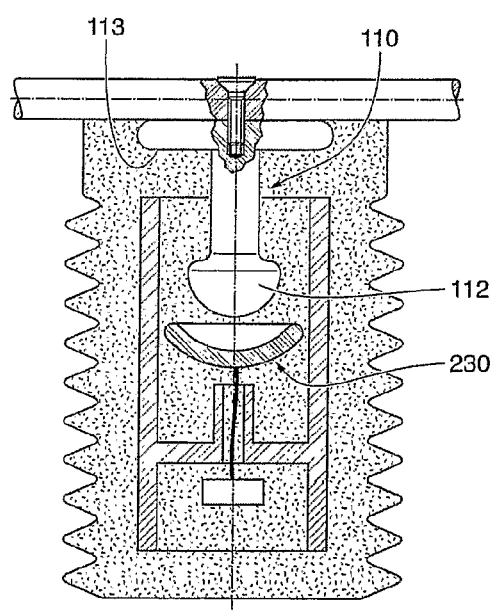
FIG. 6 shows schematically a sixth embodiment in the form of a variant of the embodiment of FIG. 2.

Description of the Sixth Embodiment—FIG. 6

With reference to FIG. 6, this shows a variant of the embodiment shown in FIG. 2.

In this sixth embodiment, the sensor, indicated here by 230, is shaped in the form of a spherical dome (similar to the dome 130 of FIG. 5) with its open base facing upwards and towards the source electrode 110, and, optionally, said spherical dome 230 has an inner surface positioned so as to be equidistant from the outer surface of the spherical segment 112 facing it.

Figure 7:
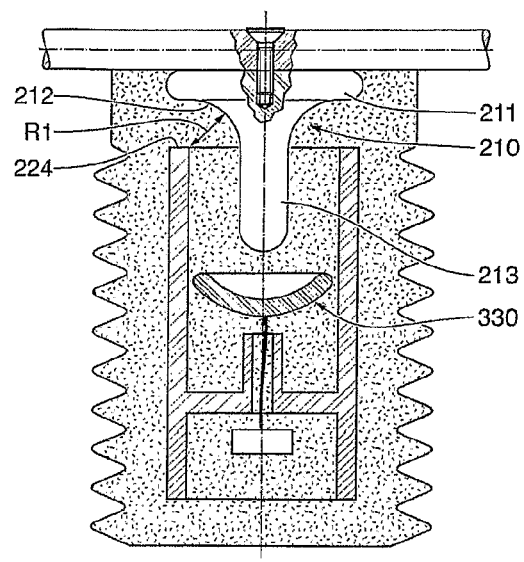
FIG. 7 shows schematically a seventh embodiment in the form of a variant of the embodiment of FIG. 3.

Description of the Seventh Embodiment—FIG. 7

With reference to FIG. 7, this shows a variant of the embodiment shown in FIG. 3.

In this seventh embodiment, the sensor, indicated here by 330, is shaped in the form of a spherical dome (similar to the dome 130 of FIG. 5) with its open base facing upwards and towards the source electrode 210.

Figure 8:
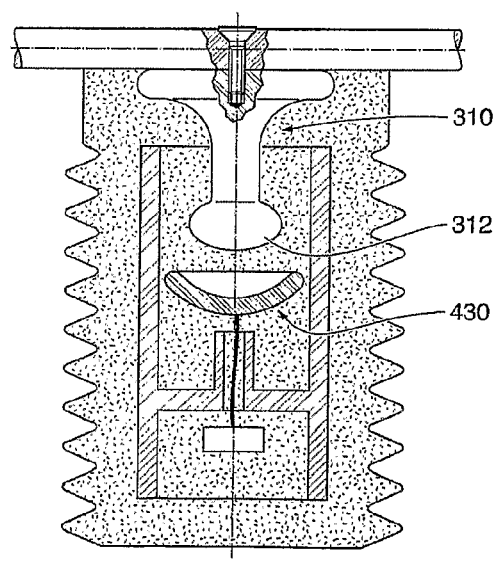
FIG. 8 shows schematically an eighth embodiment in the form of a variant of the embodiment of FIG. 4.

Description of the Eighth Embodiment—FIG. 8

With reference to FIG. 8, this shows a variant of the embodiment shown in FIG. 4.

In this eighth embodiment, the sensor, indicated here by 430, is shaped in the form of a spherical dome (similar to the dome 130 of FIG. 5) with its open base facing upwards and towards the source electrode 310, and, optionally, said spherical dome 430 has an inner surface positioned so as to be equidistant from the outer surface of the spherical segment 312 facing it.

Figure 9:
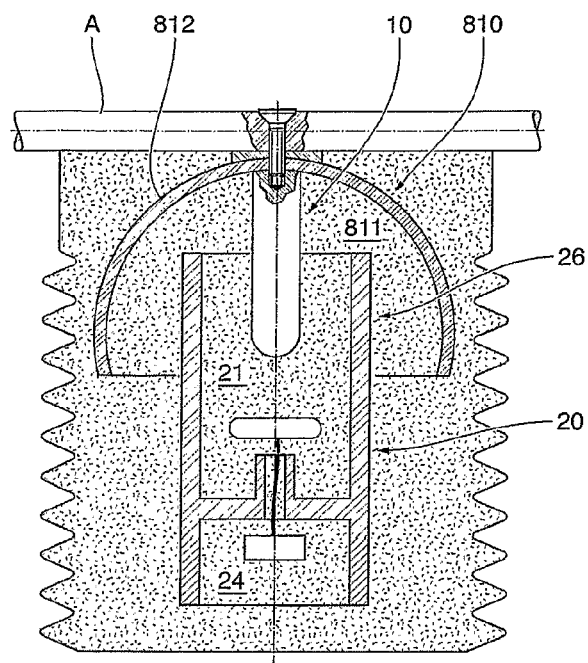
FIG. 9 shows schematically a ninth embodiment in the form of a variant of any one of the preceding embodiments.

Description of the Ninth Embodiment—FIG. 9

With reference to FIG. 9, this shows a variant embodiment in which there is provided, relative to any one of the preceding embodiments, a further screen element 810 forming a third inner chamber 811 inside which the source electrode 10 or an electrode of different type and/or shape is placed.

Said further screen element 810 is formed from conductive material and is connected to the conductor A and to the source electrode 10.

More specifically and preferably, said second screen element 810 is shaped in the form of a spherical dome 812 with an open end facing downwards, and the aforesaid screen element 20 has a proximal portion 26 placed inside the third screened chamber 811.

The above description of the capacitive sensor for detecting an electrical field is provided solely by way of non-limiting example, and clearly, therefore, said sensor can be modified or varied in any way suggested by experience and/or its use or application within the scope of the following claims.

The following claims consequently also form an integral part of the above description.

The invention claimed is:

1. A capacitive sensor for sensing an electrical field generated by a live conductor, comprising a source electrode, a screen element, and an electrical field sensor, in which the source electrode has a proximal portion connected to the live conductor and a distal portion placed inside the screen element; in which the electrical field sensor is placed inside the screen element so that it faces and is spaced apart from the distal portion of the source electrode in order to detect the electrical field emitted by the distal portion of the source electrode, in which the source electrode the screen element and the electrical field sensor are positioned with respect to each other by means of a dielectric medium in which they are embedded, in which the screen element comprises a first screened chamber having a first open end facing the live conductor, in which the source electrode passing through the first open end has a distal portion placed inside the first screened chamber, in which the electric field sensor is placed inside the first screened chamber and is axially spaced apart from the distal portion of the source electrode, wherein a portion of the source electrode is shaped in the form of a solid funnel with a stem orientated toward the distal end.

2. The capacitive sensor according to claim 1, wherein the sides of the funnel are rounded.

3. The capacitive sensor according to claim 2, wherein the radius of curvature of the rounded sides is determined by the minimum distance to be maintained between the circular perimeter of the proximal end of the screen element and the source electrode in order not to exceed the dielectric strength of the dielectric body, thus providing the required level of insulation.

4. The capacitive sensor according to claim 1, wherein the proximal end portion of the source electrode is disc-shaped.

5. The capacitive sensor according to claim 1, wherein the screen element has a tubular configuration.

6. The capacitive sensor according to claim 1, wherein it additionally comprises a second screen element forming an inner third chamber in which the source electrode is placed.

7. The capacitive sensor according to claim 6, wherein the second screen element is formed from conductive material and is connected to the live conductor and to the source electrode.

8. The capacitive sensor according to claim 6, wherein the second screen element is shaped in the form of a spherical dome.

9. The capacitive sensor according to claim 8, wherein the screen element has a proximal portion placed inside the third chamber formed by the further second screen element.

10. The capacitive sensor according to claim 1, characterized in that the distal end of the source electrode is shaped in the form of a spherical segment.

11. The capacitive sensor according to claim 1, wherein the electrical field sensor is shaped in the form of a spherical dome with an open base facing upward and toward the source electrode.

12. The capacitive sensor according to claim 1, wherein the distal end portion of the source electrode is shaped in the form of a spherical segment and in that the electrical field sensor is shaped in the form of a spherical dome with an open base facing upward and toward the source electrode.

13. The capacitive sensor according to claim 12, wherein the spherical dome of the electrical field sensor has an inner surface positioned equidistant from the outer surface of the distal end of the spherical segment of the source electrode facing it.

14. The capacitive sensor according to claim 1, wherein the screen element additionally comprises a second screened chamber placed in the distal portion of the screen element, and in that a circuit for treating the signal detected by the electrical field sensor is placed inside the second chamber.

15. The capacitive sensor according to claim 1, wherein the screen element additionally comprises a screened duct by means of which the first chamber is made to communicate with the second chamber, and in that an electrical conductor connecting the electrical field sensor with the signal treatment circuit is placed inside the screened duct.

16. The capacitive sensor according to claim 14, wherein the distal end portion of the source electrode is shaped in the form of a spherical segment.

17. A capacitive sensor for sensing an electrical field generated by a live conductor, comprising a source electrode a screen element and an electrical field sensor, in which the source electrode has a proximal portion connected to the live conductor and a distal portion placed inside the screen element, in which the electrical field sensor is placed inside the screen element so that it faces and is spaced apart from the distal portion of the source electrode in order to detect the electrical field emitted by the distal portion of the source electrode, in which the source electrode and the screen element and the electrical field sensor are positioned with respect to each other by means of a dielectric medium in which they are embedded, in which the screen element comprises a first screened chamber having a first open end facing the live conductor, in which the source electrode passing through the first open end has a distal portion placed inside the first screened chamber, in which the electric field sensor is placed inside the first screened chamber and is axially spaced apart from the distal portion of the source electrode, wherein the proximal end portion connected to the live conductor of the source electrode is disc-shaped.

18. The capacitive sensor according to claim 17, wherein the distal portion of the source electrode has a cylindrical shape with a rounded distal end.

* * * * *